US009456527B2

(12) United States Patent
Arvelo et al.

(10) Patent No.: US 9,456,527 B2
(45) Date of Patent: Sep. 27, 2016

(54) FABRICATING SEPARABLE AND INTEGRATED HEAT SINKS FACILITATING COOLING MULTI-COMPONENT ELECTRONIC ASSEMBLY

(71) Applicant: INTERNATIONAL BUSINESS MACHINES CORPORATION, Armonk, NY (US)

(72) Inventors: Amilcar R. Arvelo, Poughkeepsie, NY (US); Levi A. Campbell, Poughkeepsie, NY (US); Michael J. Ellsworth, Jr., Poughkeepsie, NY (US); Eric J. McKeever, Poughkeepsie, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 136 days.

(21) Appl. No.: 14/551,464

(22) Filed: Nov. 24, 2014

(65) Prior Publication Data
US 2015/0075755 A1 Mar. 19, 2015

Related U.S. Application Data

(63) Continuation of application No. 13/862,710, filed on Apr. 15, 2013, now Pat. No. 9,210,831.

(51) Int. Cl.
*H05K 7/20* (2006.01)
*F28D 15/00* (2006.01)
(Continued)

(52) U.S. Cl.
CPC ........... *H05K 7/20281* (2013.01); *B21D 53/04* (2013.01); *F28D 15/00* (2013.01);
(Continued)

(58) Field of Classification Search
CPC ............... H05K 7/20281; H05K 7/20772; F28D 15/00; B21D 53/04; H01L 23/473; H01L 2924/0002; Y10T 29/4935

USPC .......... 361/688–723; 165/104.33; 29/890.03, 29/890.035
See application file for complete search history.

(56) References Cited

U.S. PATENT DOCUMENTS 5,016,090 A * 5/1991 Galyon ............... H01L 23/4336
257/714
5,021,924 A 6/1991 Kieda et al.
(Continued)

FOREIGN PATENT DOCUMENTS

CN 2664194 Y 12/2004

OTHER PUBLICATIONS

Arvelo et al., Office Action for U.S. Appl. No. 13/862,710, filed Apr. 15, 2013 (U.S. Patent Publication No. 2014/0307389 A1), dated Mar. 31, 2015 (14 pages).
(Continued)

*Primary Examiner* — Anthony Haughton
*Assistant Examiner* — Yahya Ahmad
(74) *Attorney, Agent, or Firm* — Margaret A. McNamara, Esq.; Kevin P. Radigan, Esq.; Heslin Rothenberg Farley & Mesiti P.C.

(57) ABSTRACT

Methods of fabricating cooling apparatus are provided which facilitate cooling a multi-component assembly, such as a hub module assembly. The cooling apparatus includes a first liquid-cooled heat sink configured to facilitate removal of heat generated by one or more first electronic components of the multi-component assembly, and a second liquid-cooled heat sink configured to facilitate removal of heat generated by one or more second electronic components of the multi-component assembly. The first liquid-cooled heat sink is separably coupled to the multi-component assembly, and the second liquid-cooled heat sink is fixedly secured to the multi-component assembly. Fluid couplers fluidically couple the first and second liquid-cooled heat sinks to facilitate liquid coolant flow through the fixedly-secured, second liquid-cooled heat sink from the separably-coupled, first liquid-cooled heat sink.

13 Claims, 13 Drawing Sheets

(51) Int. Cl.
*B21D 53/04* (2006.01)
*H01L 23/473* (2006.01)

(52) U.S. Cl.
CPC ....... *H01L 23/473* (2013.01); *H05K 7/20772* (2013.01); *H01L 2924/0002* (2013.01); *Y10T 29/4935* (2015.01); *Y10T 29/49359* (2015.01)

(56) References Cited

U.S. PATENT DOCUMENTS

| | | |
|---|---|---|
| 6,179,047 B1 | 1/2001 | Tustaniwskyj et al. |
| 6,317,326 B1 | 11/2001 | Vogel et al. |
| 6,552,901 B2 | 4/2003 | Hildebrandt |
| 6,930,884 B2 | 8/2005 | Cromwell et al. |
| 7,336,487 B1 | 2/2008 | Chrysler et al. |
| 7,486,516 B2 | 2/2009 | Colbert et al. |
| 7,606,033 B2 | 10/2009 | Colbert et al. |
| 7,825,246 B2 | 11/2010 | Cao et al. |
| 7,830,664 B2 | 11/2010 | Campbell et al. |
| 7,990,722 B2 | 8/2011 | Cao et al. |
| 8,363,404 B2 | 1/2013 | Colbert et al. |
| 9,210,831 B2 * | 12/2015 | Arvelo .................. B21D 53/04 |
| 2004/0228094 A1 | 11/2004 | Ahmed et al. |
| 2004/0252462 A1 | 12/2004 | Cromwell et al. |
| 2007/0086168 A1 | 4/2007 | Khanna et al. |
| 2008/0084664 A1 * | 4/2008 | Campbell ................. G06F 1/20 361/699 |
| 2008/0285230 A1 * | 11/2008 | Bojan ................ H05K 7/20872 361/689 |
| 2009/0213541 A1 | 8/2009 | Butterbaugh et al. |
| 2011/0205708 A1 | 8/2011 | Andry et al. |
| 2012/0087088 A1 * | 4/2012 | Killion ................ F28D 15/0266 361/697 |
| 2012/0098119 A1 | 4/2012 | Refai-Ahmed et al. |
| 2012/0212175 A1 | 8/2012 | Sharaf et al. |
| 2014/0307389 A1 | 10/2014 | Arvelo et al. |

OTHER PUBLICATIONS

"Water Cooled Lid for Multiple Stacked Chip Design", IBM Technical Disclosure Bulletin, IPCOM000201795D, e-published Nov. 23, 2010 (2 pages).

Arvelo et al., Notice of Allowance for U.S. Appl. No. 13/862,710, filed Apr. 15, 2013 (U.S. Patent Publication No. 2014/0307389 A1), dated Aug. 3, 2015 (10 pages).

* cited by examiner

FABRICATING SEPARABLE AND INTEGRATED HEAT SINKS FACILITATING COOLING MULTI-COMPONENT ELECTRONIC ASSEMBLY

CROSS-REFERENCE TO RELATED APPLICATION

This application is a continuation of U.S. Ser. No. 13/862,710, filed Apr. 15, 2013, entitled, "Separable and Integrated Heat Sinks Facilitating Cooling Multi-Component Electronic Assembly", which was published Oct. 16, 2014, as U.S. Patent Publication No. 2014/0307389 A1, and which is hereby incorporated herein by reference in its entirety.

BACKGROUND

As is known, operating electronic components produce heat. This heat should be removed in order to maintain device junction temperatures within desirable limits, with failure to remove heat effectively resulting in increased component temperatures, potentially leading to thermal runaway conditions. Several trends in the electronics industry have combined to increase the importance of thermal management, including heat removal for electronic components, including technologies where thermal management has traditionally been less of a concern, such as CMOS. In particular, the need for faster and more densely packed circuits has had a direct impact on the importance of thermal management. First, power dissipation, and therefore heat production, increases as device operating frequencies increase. Second, increased operating frequencies may be possible at lower device junction temperatures. Further, as more and more devices or components are packed onto a single chip, heat flux (Watts/cm$^2$) increases, resulting in the need to remove more power from a given size chip or module. These trends have combined to create applications where it is no longer desirable to remove heat from modern devices solely by traditional air cooling methods, such as by using air cooled heat sinks with heat pipes or vapor chambers. Such air cooling techniques are inherently limited in their ability to extract heat from an electronic component with high power density. The need to cool current and future high heat load, high heat flux electronic devices therefore mandates the development of aggressive thermal management techniques, using, for instance, liquid cooling.

As an example, some existing supercomputers have compute nodes that route their traffic through racks of switching equipment to other compute nodes. Every switch in this data path adds latency. At a supercomputing scale, there is a point that increasing the number of compute drawers will not increase performance due to the additional switching latency.

In a system using hub modules, networking and compute traffic is routed to idle compute processors with the hub modules to maximize speed and efficiency. In the system, every compute drawer is directly connected to every other compute drawer via the hub modules, which typically include traffic routing hub chips and a network of fiber-optic transmit and receive modules.

In a system with a network of fiber optic transmit and receive modules or fiber optic interconnects, scalability is enabled to a much higher level than previously possible. However, a problem exists creating a reliable arrangement having manufacturability and delivering a required package density and heat removal.

BRIEF SUMMARY

The shortcomings of the prior art are overcome and additional advantages are provided through, in one aspect, the provision of a method, which comprises: providing a first liquid-cooled heat sink comprising at least one coolant-carrying first channel, the first liquid-cooled heat sink being separably coupled to an electronic assembly comprising at least one first electronic component and at least one second electronic component, and facilitating removal of heat generated by the at least one first electronic component; providing a second liquid-cooled heat sink comprising at least one coolant-carrying second channel, the second liquid-cooled heat sink being fixedly-secured to the electronic assembly, and facilitating removal of heat generated by the at least one second electronic component; and providing fluid couplers fluidically coupling the first and second liquid-cooled heat sink, and facilitating liquid coolant flow through the at least one coolant-carrying second channel of the fixedly-secured, second liquid-cooled heat sink from the separably-coupled, first liquid-cooled heat sink.

In a further aspect, a method is provided which includes fabricating a cooling apparatus to facilitate cooling an electronic assembly comprising at least one first electronic component and at least one second electronic component. Fabricating the cooling apparatus includes: separably coupling a first liquid-cooled heat sink to the electronic assembly to facilitate removal of heat generated by the at least one first electronic component, the first liquid-cooled heat sink comprising at least one coolant-carrying first channel; fixedly securing a second liquid-cooled heat sink to the electronic assembly to facilitate removal of heat generated by the at least one second electronic component, the second liquid-cooled heat sink comprising at least one coolant-carrying second channel; and providing fluid couplers fluidically coupling the first and second liquid-cooled heat sinks, the fluidic coupling facilitating liquid coolant flow through the at least one coolant-carrying second channel of the fixedly-secured, second liquid-cooled heat sink from the separably-coupled, first liquid-cooled heat sink.

Additional features and advantages are realized through the techniques of the present invention. Other embodiments and aspects of the invention are described in detail herein and are considered a part of the claimed invention.

BRIEF DESCRIPTION OF THE SEVERAL VIEWS OF THE DRAWINGS

One or more aspects of the present invention are particularly pointed out and distinctly claimed as examples in the claims at the conclusion of the specification. The foregoing and other objects, features, and advantages of the invention are apparent from the following detailed description taken in conjunction with the accompanying drawings in which:

DETAILED DESCRIPTION

Figure 1:
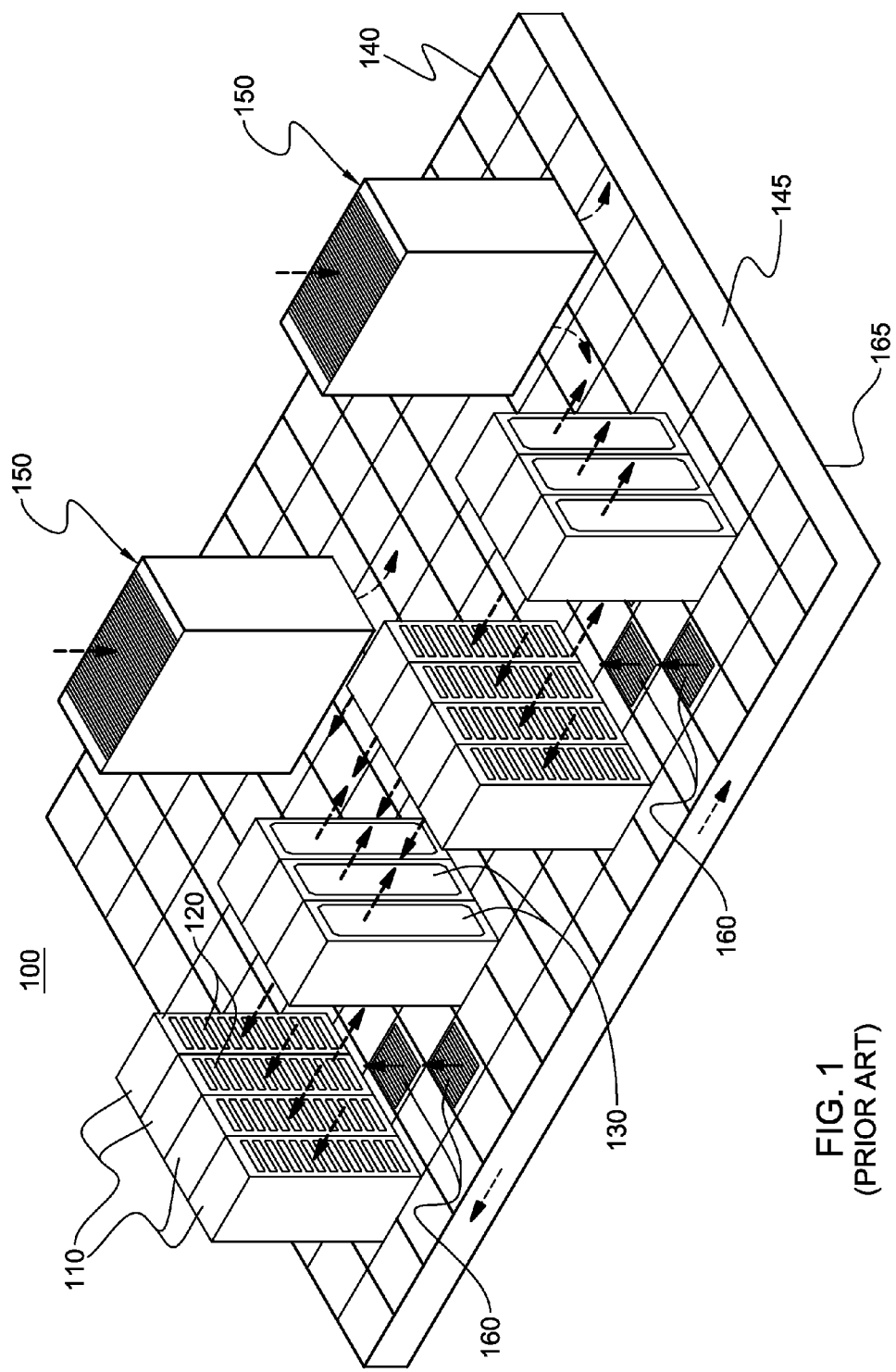
FIG. 1. depicts one embodiment of a conventional raised floor layout of an air-cooled data center.

Aspects of the present invention and certain features, advantages, and details thereof, are explained more fully below with reference to the non-limiting embodiments illustrated in the accompanying drawings. Descriptions of well-known materials, fabrication tools, processing techniques, etc., are omitted so as not to unnecessarily obscure the invention in detail. It should be understood, however, that the detailed description and the specific examples, while indicating embodiments of the invention, are given by way of illustration only, and unless otherwise specified, are not by way of limitation. Various substitutions, modifications, additions and/or arrangements within the spirit and/or scope of the underlying inventive concepts will be apparent to those skilled in the art from this disclosure.

As used herein, the terms "electronics rack" and "rack unit" are used interchangeably, and unless otherwise specified include any housing, frame, rack, compartment, blade server system, etc., having one or more heat-generating components of a computer system, electronic system, or information technology equipment, and may be, for example, a stand-alone computer processor having high-, mid- or low-end processing capability. In one embodiment, an electronics rack may comprise a portion of an electronic system, a single electronic system, or multiple electronic systems, for example, in one or more sub-housings, blades, books, drawers, nodes, compartments, etc., having one or more heat-generating electronic components disposed therein. An electronic system(s) within an electronics rack may be movable or fixed relative to the electronics rack, with rack-mounted electronic drawers and blades of a blade-center system being two examples of electronic systems (e.g., subsystems or nodes) of an electronics rack to be cooled.

"Electronic component" refers to any heat generating electronic component of, for example, an electronic system or other unit requiring cooling. By way of example, an electronic component may comprise one or more integrated circuit dies and/or other electronic devices to be cooled, including one or more processor dies, memory dies or memory support dies. As a further example, the electronic component may comprise one or more bare dies or one or more packaged dies disposed on a common carrier. Further, unless otherwise specified herein, the terms "liquid-cooled heat sink", or "liquid-cooled structure" each refer to any conventional thermally conductive structure having a plurality of channels or passageways formed therein for flowing of liquid-coolant therethrough.

As used herein, a "liquid-to-liquid heat exchanger" may comprise, for example, two or more coolant flow paths, formed of thermally conductive tubing (such as copper or other tubing) in thermal or mechanical contact with each other. Size, configuration and construction of the liquid-to-liquid heat exchanger can vary without departing from the scope of the invention disclosed herein. Further, "data center" refers to a computer installation containing, for example, one or more electronics racks to be cooled. As a specific example, a data center may include one or more rows of rack-mounted computing units, such as server units.

One example of facility coolant and system coolant is water. However, the concepts disclosed herein are readily adapted to use with other types of coolant on the facility side and/or on the system side. For example, one or more of these coolants may comprise a brine, a dielectric liquid, a fluorocarbon liquid, a liquid metal, or other similar coolant, or refrigerant, while still maintaining the advantages and unique features of the present invention.

Reference is made below to the drawings, which are not drawn to scale for ease of understanding, wherein the same reference numbers used throughout different figures designate the same or similar components.

FIG. 1 depicts a raised floor layout of an air cooled data center 100 typical in the prior art, wherein multiple electronics racks 110 are disposed in one or more rows. A data center such as depicted in FIG. 1 may house several hundred, or even several thousand microprocessors. In the arrangement illustrated, chilled air enters the computer room via perforated floor tiles 160 from a supply air plenum 145 defined between the raised floor 140 and a base or sub-floor 165 of the room. Cooled air is taken in through louvered covers at air inlet sides 120 of the electronics racks and expelled through the backs, that is, air outlet sides 130, of the electronics racks. Each electronics rack 110 may have one or more air moving devices (e.g., fans or blowers) to provide forced inlet-to-outlet airflow to cool the electronic devices within the subsystem(s) of the rack. The supply air plenum 145 provides conditioned and cooled air to the air-inlet sides of the electronics racks via perforated floor tiles 160 disposed in a "cold" aisle of the computer installation. The conditioned and cooled air is supplied to plenum 145 by one or more air conditioning units 150, also disposed within data center 100. Room air is taken into each air conditioning unit 150 near an upper portion thereof. This room air may comprise in part exhausted air from the "hot" aisles of the computer installation defined, for example, by opposing air outlet sides 130 of electronics racks 110.

Figure 2:
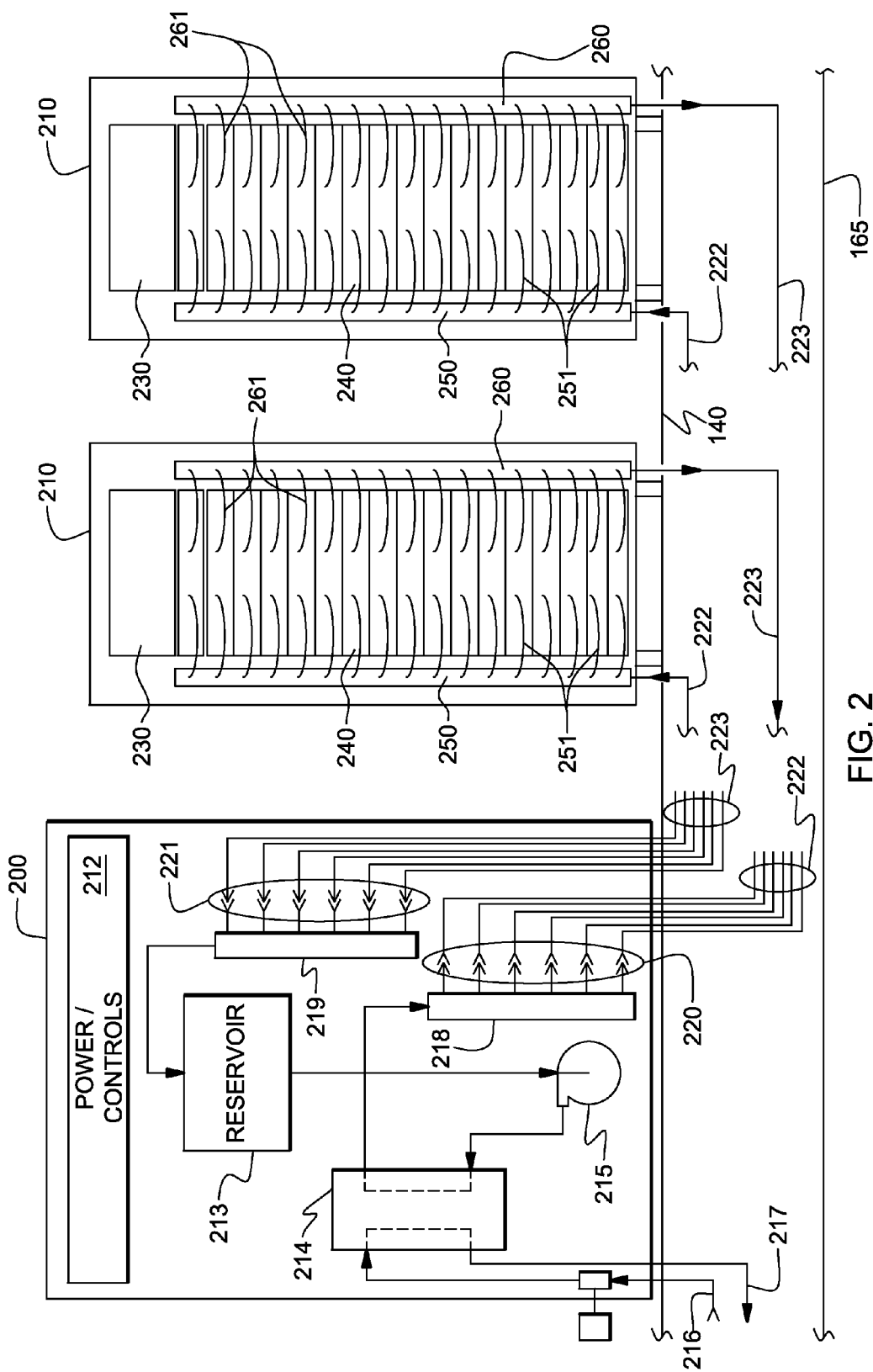
FIG. 2 depicts one embodiment of an at least partially liquid-cooled data center which includes a coolant distribution unit facilitating liquid-cooling of electronics racks of the data center, in accordance with one or more aspects of the present invention.
Figure 3:
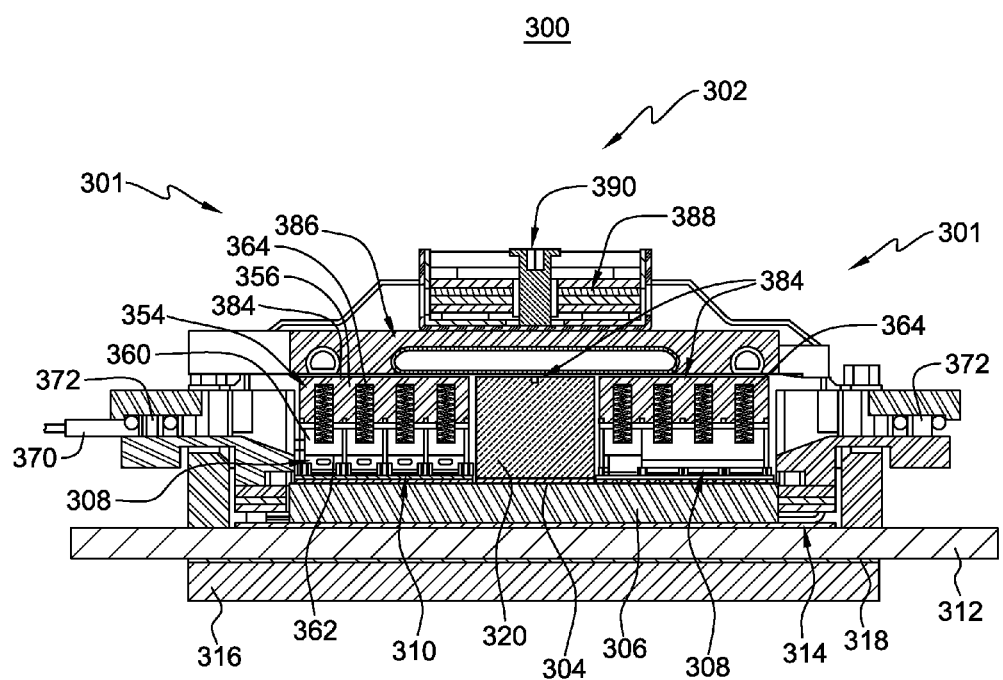
FIG. 3 depicts a cross-sectional elevational view of one embodiment of a cooled electronic system comprising a hub module assembly and one embodiment of a cooling apparatus, in accordance with one or more aspects of the present invention.

Due to the ever-increasing airflow requirements through electronics racks, and the limits of air distribution within the typical data center installation, liquid-based cooling is being combined with the above-described conventional air-cooling. FIGS. 2-3 illustrate one embodiment of a data center implementation employing a hybrid air- and liquid-based cooling system with one or more liquid-cooled heat sinks or cold plates coupled to high heat-generating electronic components disposed within the electronics racks.

FIG. 2 depicts one embodiment of an at least partially liquid-cooled data center which includes a coolant distribution unit 200 having a power/control element 212, a reservoir/expansion tank 213, a heat exchanger 214, a pump 215 (possibly accompanied by a redundant second pump), facility water inlet 216 and outlet 217 supply pipes, a supply manifold 218 supplying water or system coolant to the electronics racks 210 via couplings 220 and lines 222, and a return manifold 219 receiving water from the electronics racks 210, via lines 223 and couplings 221. Each electronics rack includes (in one example) a power/control unit 230 for the electronics rack, multiple electronic systems 240, a system coolant supply manifold 250, and a system coolant return manifold 260. In this embodiment, each electronics rack 210 is disposed on raised floor 140 of the data center, with lines 222 providing system coolant to system coolant supply manifolds 250 and lines 223 facilitating return of system coolant from system coolant return manifolds 260 shown disposed in the supply air plenum beneath the raised floor.

In the embodiment illustrated, the system coolant supply manifold 250 provides system coolant to the cooling systems of the electronic systems (more particularly, for example, to liquid-cooled cold plates thereof) via flexible hose connections 251, which are disposed between the supply manifold and the respective electronic systems within the rack. Similarly, system coolant return manifold 260 is coupled to the electronic subsystems via flexible hose connections 261. Quick connect couplings may be employed at the interface between flexible hoses 251, 261 and the individual electronic systems. By way of example, these quick connect couplings may comprise various types of commercially available couplings, such as those available from Colder Products Company, of St. Paul, Minn., USA, or Parker Hannifin, of Cleveland, Ohio, USA.

Although not shown, electronics rack 210 may also include an air-to-liquid heat exchanger disposed at an air outlet side thereof, which also receives system coolant from the system coolant supply manifold 250 and returns system coolant to the system coolant return manifold 260.

Within the electronics racks, system coolant may be provided to a variety of cooled electronic assemblies, including, for instance, to a liquid-cooled hub module assembly, such as described below with reference to FIGS. 3-5.

FIG. 3 depicts a cooled electronic assembly, generally designated 300, in accordance with one or more aspects of the present invention. In this example, the cooled electronic assembly is a hub module assembly which includes a hub module components assembly generally, designated by the reference character 301, and a cold plate assembly, generally designated 302. Cooled electronic assembly 300 includes a cooling apparatus implementing enhanced loading and heat removal for the self-contained unitary hub module assembly.

The hub module assembly includes a hub chip 304 carried by a hub ceramic substrate 306, and a plurality of optical modules 308 attached by a top surface metallurgy (TSM) land grid array (LGA) assembly 310 residing on the hub ceramic substrate 306. The ceramic substrate 306 is connected to a circuit board 312 through a bottom surface metallurgy (BSM) LGA interposer 314. The circuit card 312 is mounted on an associated backside stiffener member 316 separated by an insulator 318.

Figure 4A:
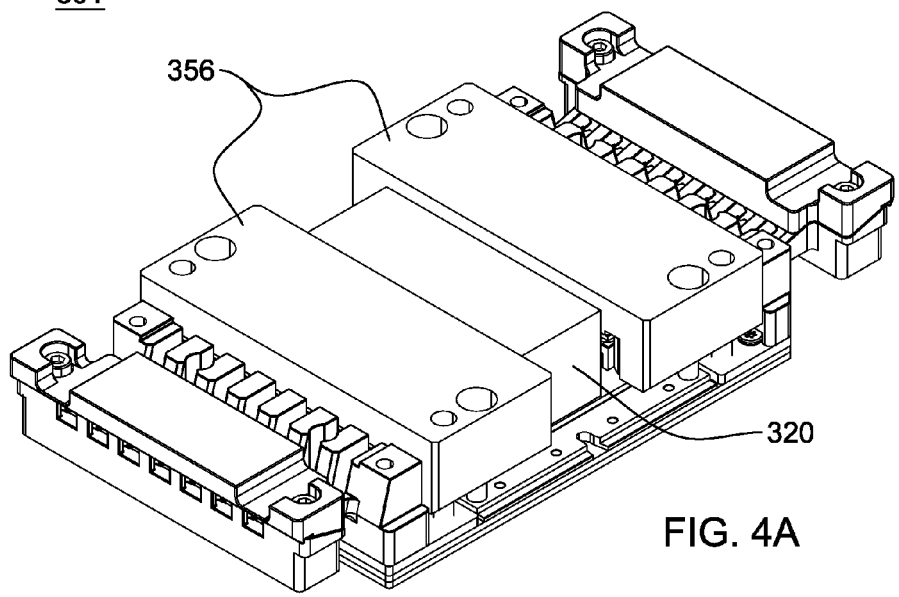
FIG. 4A depicts an isometric view of the cooled electronic system of FIG. 3, without the loading and cold plate assembly thereof, in accordance with one or more aspects of the present invention.
Figure 4B:
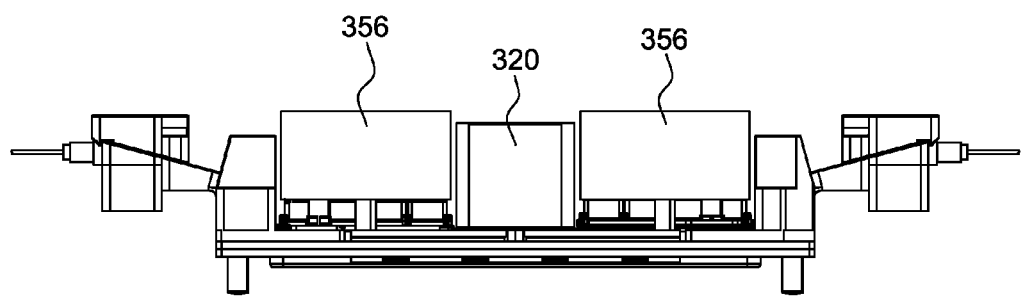
FIG. 4B is a side elevational view of the partial cooled electronic system of FIG. 4A, in accordance with one or more aspects of the present invention.
Figure 4C:
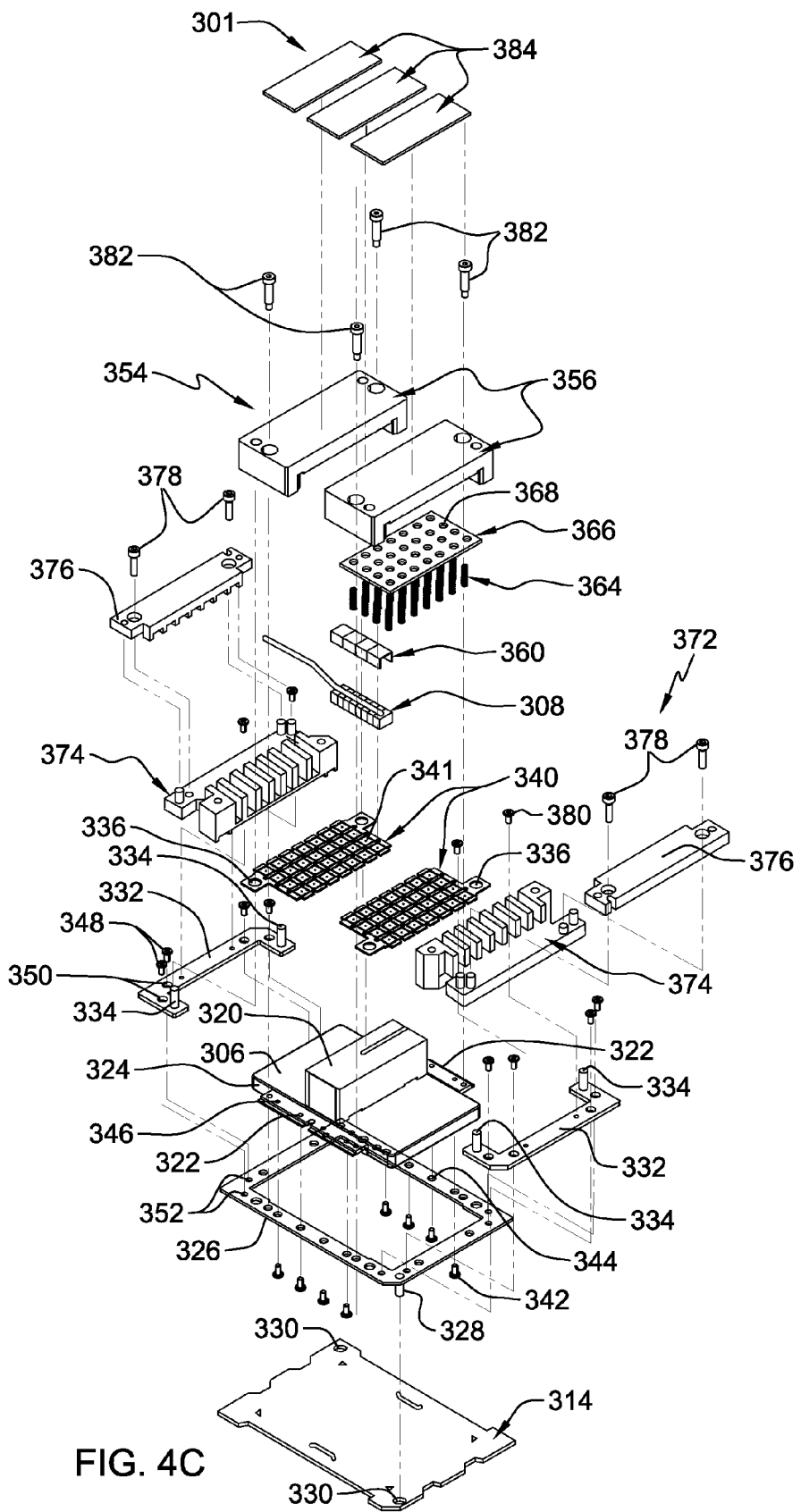
FIG. 4C is an exploded perspective view of the cooled electronic system of FIGS. 4A & 4B, in accordance with one or more aspects of the present invention.

Referring also to FIGS. 4A-4C, hub module components 301 are shown in detail. A central hub chip heat spreader 320 (such as a copper block) resides on the hub chip 304 shown in FIG. 3. A pair of bonded mounting angle brackets 322 are secured to opposed long sides 324 of the ceramic substrate 306. A unitary base alignment ring 326 includes a plurality of alignment features including alignment dowel pins 328 received through LGA interposer alignment aperture 330 with retention features or nubs for engaging the circuit board 312 shown in FIG. 3 and locating the BSM LGA interposer 314 with the circuit board. The unitary base alignment ring 326 is optically aligned with the BSM LGA pad array on the ceramic substrate 306. Each of a pair of top alignment rings 332 includes cooperating alignment features 334, such as dowel pins 334 received within a respective LGA interposer alignment aperture 336 with retention features or nubs for engaging and locating respective LGA sites of a respective LGA interposer 340 of the TSM LGA assembly 310. The pair of top alignment rings 332 are optically aligned with the respective TSM LGA pad array on the ceramic substrate 306. The two LGA interposers 340 of the TSM LGA assembly 310 align, retain, and make the electrical connection between the optical modules 308 and the hub chip 304.

Each of the two LGA interposers 340 includes molded features 341 in the interposer that act as springs to center the optical modules 308. Also, features in the alignment apertures 336 center the holes on the pins as well as aid retention of a loose interposer onto the dowel pins. The molded features 341 include small hook features which retain individual modules 308 once they are set on the LGA interposer 340.

A plurality of lower alignment ring mounting fasteners 342 are received through corresponding respective apertures 344 having required positioning clearance for the optical alignment process and threaded apertures 346 in the unitary base alignment ring 326 and the edge bonded mounting angle brackets 324. A plurality of upper alignment ring mounting fasteners 348 are received through corresponding respective apertures 350 having required positioning clearance for the optical alignment process and threaded apertures 352 in the pair of top alignment rings 332 and the unitary base alignment ring 326.

The base alignment ring 326 and the pair of top alignment rings 332 are attached to the mounting brackets 322. A heat removal and load assembly 354 includes a respective global heat spreader member 356 provided for a respective group of the plurality of optical modules 308 to remove heat and apply module load at the respective LGA sites on the top surface metallurgy (TSM) LGA assembly 310.

By way of example, the hub module assembly may include 56 optical modules 308 arranged in two groups of 28 optical modules 308 mirrored about the center hub chip 304. The optical modules 308 may be optical laser transmitter and receiver modules having via land grid array (LGA) connections on the top surface metallurgy (TSM) LGA assembly 310 residing on the ceramic substrate 306.

The heat removal and load assembly 354 includes the global heat spreader 356 shown in FIG. 4C in contact with each of the plurality of optical modules 308 to facilitate loading of the modules to make the LGA interconnect, and also to remove heat created during operation. Each module 308 has, in one embodiment, a copper saddle 360 best shown in FIG. 4C, that is loaded against the global heat spreader 356 through the first thermal interface material 362 in the heat removal path. Each copper saddle 360 has a small coil spring 364 bearing down on it to provide the controlled load required to make a reliable LGA connection, and to protect from overloading individual optical modules 308.

In accordance with aspects of the present invention, due to the high load required on the overall assembly, for example, approximately 680 lbs and the small load required on each optical module, such as less than 10 lbs, the coil springs 364 function as buffers, preventing the tallest optical module 308 from being crushed and the shortest from getting no load. The coil springs 364 are bonded into cavities in the global heat spreader 356. The global heat spreader 356 has, for instance, a perforated sheet 366 of thermal interface material (TIM) with respective openings 368 on the base that allows each coil spring 364 to pass through, but touches the remaining area of the top of each saddle 356. The optical modules 308 transmit and receive through a flat fiber ribbon 370 that escapes horizontally.

Due to the hand-plug nature of the hub modules 308 and the potential of accidentally influencing the positions of modules 308 while handling and manipulating fiber 370, for example, due to the light preload, a strain relief assembly 372 is provided to isolate the optical modules from the terminal ends of the fiber 370.

As shown in FIGS. 3-4C, the strain relief assembly 372 includes a flat ribbon strain relief member 374, a strain relief cover member 376, a plurality of strain relief cover mounting screws 378, and a plurality of fiber ribbon strain relief mounting fasteners 380. A plurality of global heat spreader mounting fasteners 382 are received through each of the global heat spreader members 356 fastening to the mounting brackets 322. An upper, final thermal interface 384 is provided by a respective thin sheet of indium resting on the top surface of the global heat spreader members 356 and the central copper heat spreader 320 residing on the hub chip 304.

Figure 5:
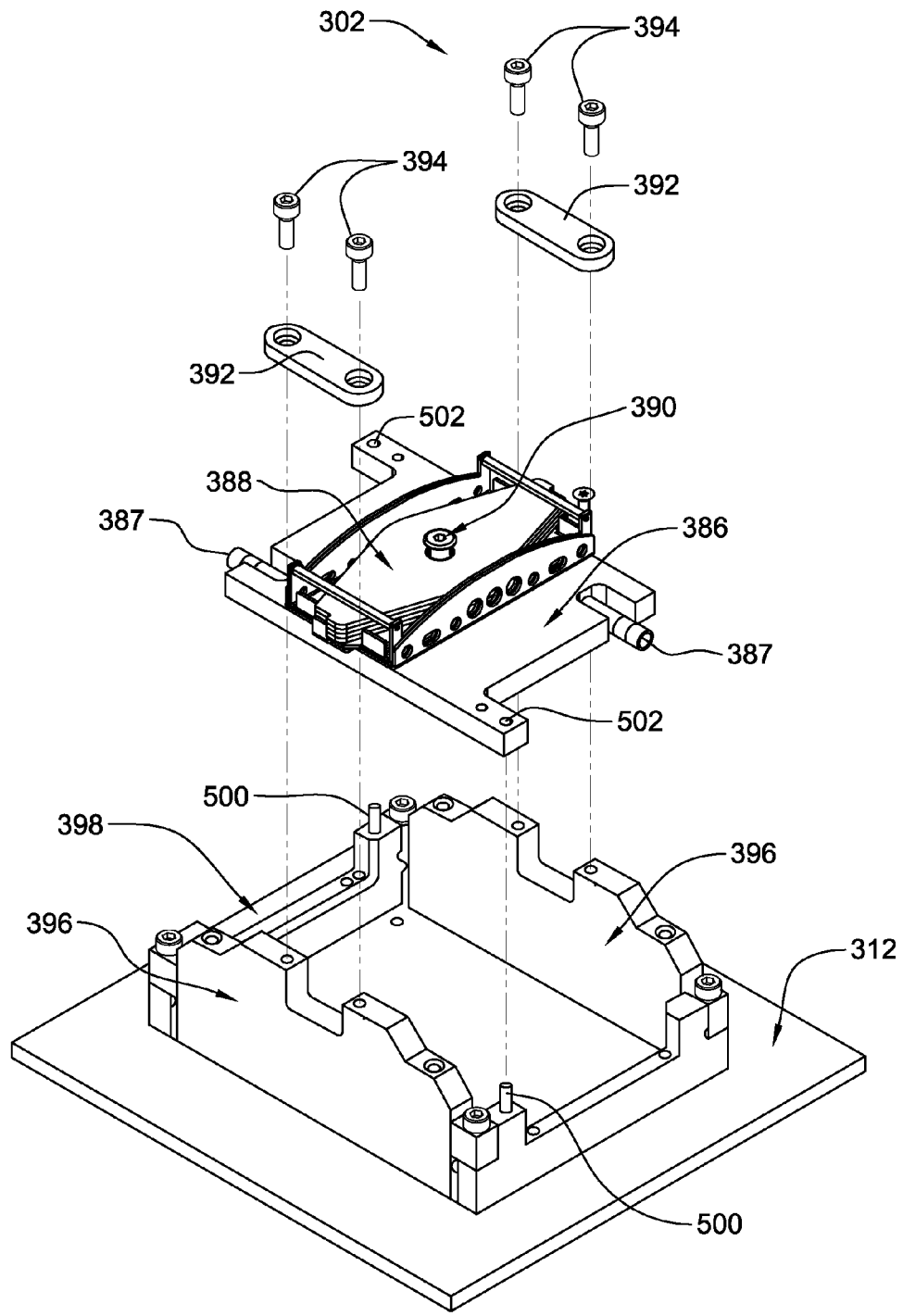
FIG. 5 is an exploded perspective view of one embodiment of a loading assembly of the cooled electronic system of FIG. 3, in accordance with one or more aspects of the present invention.

Referring also to FIG. 5, there is shown a cold plate assembly generally designated 302 of the hub module assembly. The cold plate assembly 302 includes a water cooled cold plate 386. Cooling water is circulated through conduits 387. The indium thin sheet final thermal interface 384 provided on the top surface of both global heat spreaders 356 and the central copper heat spreader 320 is located in contact engagement with the base of the cold plate 386. The indium pads 384 can be reused if a system is reworked within manufacturing, which reduces cost and decreases system rework cycle time.

The cold plate assembly 302 of FIGS. 3 & 5 includes a laminated spring plate 388, a centrally located fastener 390, and a pair of spring end support brackets 392 receiving spring end support bracket fasteners 394 and mounted to a respective card mounted cross brace 396. A pair of long stiffening rails 398 provided between the card mounted cross brace 396 and mounted to the circuit board 312. The long stiffening rails 398 and the cold plate 386 includes respective cooperating alignment features 500 and 502 positioning and retaining the cold plate 386.

The cold plate load is provided by fastening the plurality of fasteners 394 on the spring end support brackets 392 and the card mounted cross braces 396, and bottoming the head of the load fastener 390 against the laminated spring plate 388. A total system load of 680 lbs is generated by deflecting the laminated spring plate 388 retained at both ends via the centrally located screw 390. The screw tip acts directly on the cold plate assembly 302, driving the reaction load vertically through the hardware stack.

When the hub module 301 is not loaded by a cold plate 386, the global heat spreader top surfaces are higher than the top of the central copper heat spreader 320 residing on the hub chip. Each global heat spreader 356 is captivated by the global heat spreader mounting shoulder fasteners 382, and in this condition there is some small coil spring compression that maintains a preload on the optical modules 308. This maintains optical module position, as well as reducing wear on the gold LGA pads due to vibration induced surface scrubbing. When the cold plate load is applied, both global heat spreaders 356 move down, compressing the array of coil springs 364, increasing the module load at the respective TSM LGA sites. When the top surfaces of the global heat spreaders 356 and the central copper heat spreader 320 are coplanar, the full design load has been applied to the optical module TSM LGA sites. The physical down stop of the central copper heat spreader 320 prevents overloading these components, because the coil springs 364 can no longer be compressed. Additional loading after the surfaces are coplanar passes through the central copper heat spreader 320 and hub chip 304 to the BSM LGA connection onto the circuit board 312, but does not increase the load on the optical modules 308 or TSM 310. By design, and as one example only, 200 lbs load passes through each global heat spreader 356 to each bank of 28 optics modules 108, and 280 lbs passes through the center spreader 320, resulting in a total of 680 lbs nominal on the BSM LGA 314. These loads are defined by how many LGA contacts are present, and the contact force requirement per contact.

In brief, the cooled electronic assembly (e.g., hub module assembly) is a reliable arrangement with effective manufacturability that delivers required package density. One of the main principles of the hub module assembly is to push complexity of system assembly into the hub module components assembly 301 by making the module self contained, test-able and shippable at the unit level, as well as hand place-able. The hub module components assembly 301 includes a large number of components, thermal interfaces, and springs while on the system manufacturing floor, the hub module is installed by hand, and the cold plate assembly 302 applies the cold plate load provided by fastening the four fasteners 394 on the spring end supports 392, 396, and bottoming the load fastener 390 against the laminated spring plate 388. Also, due to the water cooled nature of the hub module assembly 300, heat is effectively moved to the top thermal interface 384 of the hub module components assembly 301 contacting the single cold plate 386.

As one specific example, the hub module assembly of FIGS. 4-5 may comprise an IBM® Power® 775™ Supercomputer Input/Output (I/O) hub module, offered by International Business Machines Corporation of Armonk, N.Y., USA. (IBM®, Power®, and Power 775™ are trademarks of International Business Machines Corporation, Armonk, N.Y., USA.) This I/O hub module is a complex structure that routes compute traffic between a multitude of processors in the compute cluster. Integrating this function into a central electronic complex (CEC) or central processor complex (CPC) reduces switching latency, and thus improves parallel processing efficiency and eliminates external switch gear, resulting in a smaller compute footprint on the data center floor. The module packages as a "hub" chip and, in one embodiment, 56 individual opto-electrical transmitter/receiver modules (referred to herein as the optical modules) for electrical interconnection and power dissipation.

By way of specific example, the I/O hub module may have a base that is a 95 mm long×61 mm wide×7.5 mm thick glass ceramic substrate, with individual wiring layers for power and signal distribution. Located at the center at the top side of the substrate is the hub chip. In one example, this chip may be 22.05 mm×26.88 mm (592.8 mm$^2$) in size, and electrically connected to the substrate by more than 11,000 electrical contacts, such as flip chip (C4) solder interconnects. Cooling for such a hub chip is provided by the hub chip heat spreader in the example configuration of FIGS. 3-5 through, for instance, a thin silicone-based, thermally conductive adhesive between the hub chip and hub chip thermal spreader. This chip thermal interface (TIM1) may have a unit thermal resistance of, for instance 10° C. mm$^2$/W.

As noted, the optical modules (e.g., 56 optical modules) are divided into two groups of, for instance, 28 modules each, mirrored about the center hub chip. The optical modules have, in one embodiment, copper side blocks to facilitate loading of the modules to make the LGA interconnect, and also to remove heat created during operation. Each module has, by way of example, a copper saddle that is loaded against these blocks through the first thermal interface material in the heat removal path (i.e., TIM1). Each copper saddle has a small coil spring bearing on it to provide the controlled load required to make a reliable LGA connection, and to protect from overloading individual optical modules. Due to the high load required on the overall assembly (e.g., approximately 680 lbf), and the small load required on each optical module (e.g., approximately 7.1 lbf), the coil spring acts as a buffer that prevents the tallest optical module from being crushed, and the shortest optical module from receiving no load. The coil springs are bonded into cavities in the respective global heat spreader.

When the hub module is not loaded by a cold plate, the global heat spreader top surfaces are higher than the top of the central copper heat spreader residing on the hub chip. In this unloaded position, the global heat spreader is captivated by two shoulder fasteners. In this condition, there is some small coil spring compression that maintains a pre-load on the optical modules. This maintains optical module position, as well as reducing wear on the LGA pads due to vibration-induced surface scrubbing. When the cold plate load is applied, both global heat spreaders move downward, compressing the array of coil springs, independently loading each optical module and TSM LGA site. At the same time, the global spreader is compressing a thermal interface pad (TIM3) between it and the copper saddles. When the top surfaces of the global heat spreaders and the central copper heat spreader are coplanar, the full design load has been applied at optical module TSM LGA sites via each coil spring, the physical down-stop of the central copper heat spreader prevents overloading these components, because the coil springs can no longer be compressed. Additional loading after the surfaces are coplanar passes through the central copper heat spreader and chip to the BSM LGA connection onto the motherboard, but does not increase the load on the optical modules or TSM. As noted, by design, 200 lbf load may pass through heat global heat spreader to each back of 28 optics modules, and 280 lbf passes through the center spreader, resulting in a total of 680 lbf nominal on the BSM LGA. The total system load of 680 lbf is generated by deflecting a laminated spring plate retained at both ends via a centrally located fastener. The fastener tip acts directly on the cold plate assembly, driving the reaction load vertically through the hardware stack. Both global heat spreaders and the central copper heat spreaders have a thin sheet of, for instance, indium resting on the top surface, which acts as a final thermal interface (TIM2), which is in contact with the base and the cold plate. Indium is particularly beneficial in this application, as grease could be problematic in the complicated assembly, and exceedingly difficult to rework, given the lack of continuous surface. Indium pads can be reused if a system is reworked within manufacturing, which reduces costs and decreases system rework cycle time.

Figure 6:
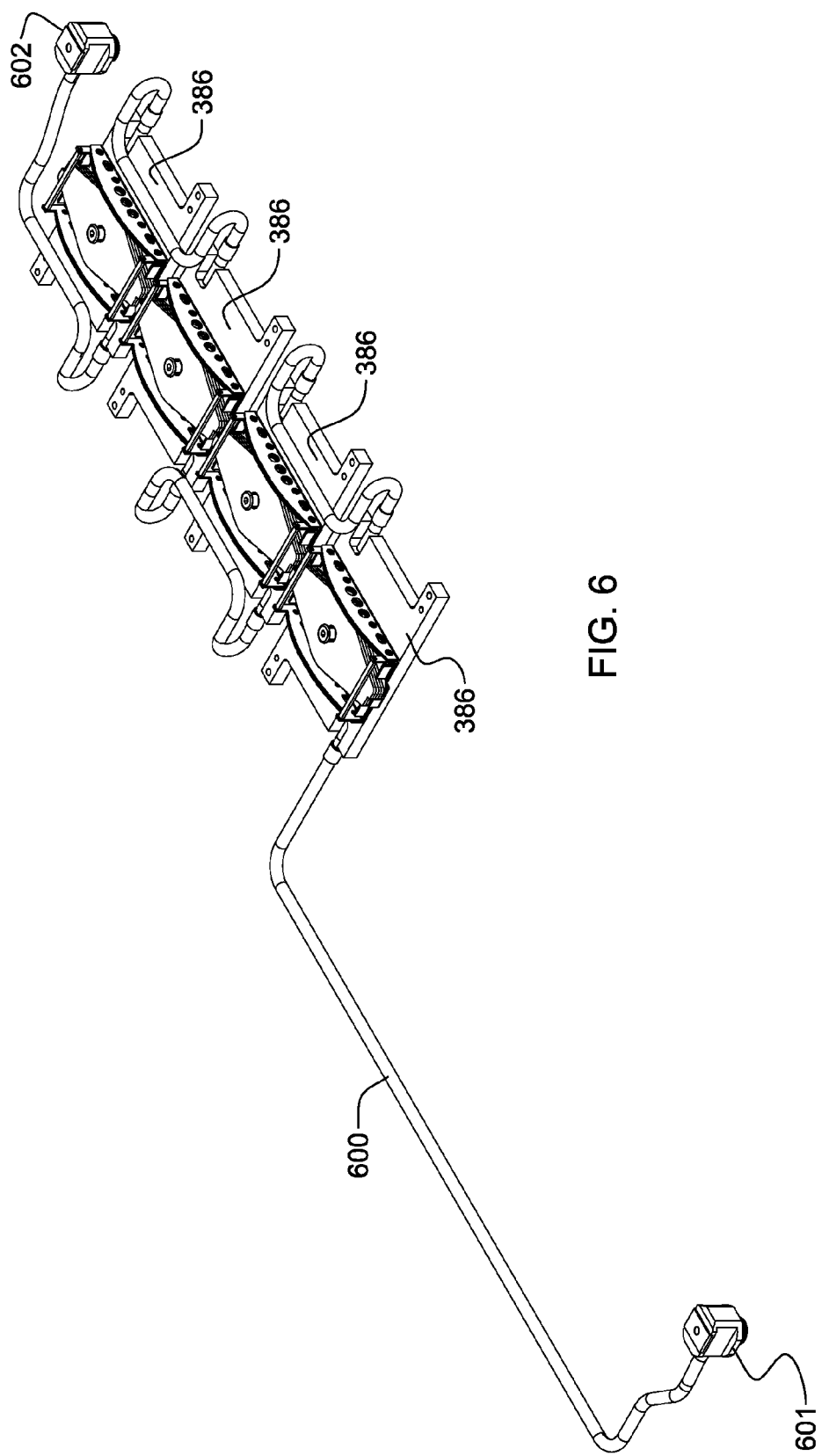
FIG. 6 depicts one embodiment of multiple liquid-cooled heat sinks and loading assemblies coupled in series-fluid communication for facilitating cooling of multiple electronic assemblies, such as multiple ones of the hub module assembly depicted in FIGS. 3-5, in accordance with an aspect of the present invention.

As illustrated in FIG. 6, at the CEC level, four hub module cold plates may be plumbed together in serial flow via appropriate liquid-coolant flow tubing 600 between a coolant supply manifold connection 601 and a coolant return manifold connection 602 as depicted. The temperature of the coolant, for instance, water, entering the fourth hub module cold plate 386 in the series increases by the caloric temperature rise due to the three upstream modules' heat loads. This temperature differential needs to be considered when assuring component temperatures are within specification.

As a further example, I/O module power dissipation may be approximately 340 W, with the hub chip dissipating 107 W, and each optic module dissipating 2.5 W. Future hub module assembly configurations may dissipate even greater heat load, requiring even greater cooling of the hub chip, while also cooling the optics modules.

Disclosed herein with reference to FIGS. 7A-9D, therefore, is an enhanced cooled electronic assembly or hub module assembly, where a portion of the cooling apparatus (i.e., a second liquid-cooled heat sink) is fixedly secured (e.g., integrated) with the electronics assembly, and another portion of the cooling apparatus (i.e., a first liquid-cooled heat sink) is separably coupled to the assembly to make fluid communication with the integrated cooling portion, while also cooling other portions of the module assembly in the more traditional, separable fashion. For instance, the second liquid-cooled heat sink (e.g., cold plate) is integrated with or bonded directly to at least one of the electronic components of a heterogeneous, multi-component module or assembly (e.g., to the hub chip), and the separable, first liquid-cooled heat sink (e.g., separate cold plate), when brought into both thermal and mechanical contact with the electronic assembly or module, makes a fluidic connection to the fixedly-secured, second liquid-cooled heat sink.

Generally stated, disclosed herein is a cooling apparatus which includes a first liquid-cooled heat sink, a second liquid-cooled heat sink, and fluid couplers. The first liquid-cooled heat sink includes at least one coolant-carrying first channel, and is separably-coupled to the electronic assembly to facilitate removal of heat generated by at least one first electronic component of the electronic assembly. The second liquid-cooled heat sink includes at least one coolant-carrying second channel, and is fixedly-secured to the electronic assembly and configured to facilitate removal of heat generated by at least one second electronic component of the electronic assembly. The fluid couplers fluidically couple the first and second liquid-cooled heat sinks, and facilitate liquid coolant flow through the at least one coolant-carrying second channel of the fixedly-secured, second liquid-cooled heat sink from the separably-coupled, first liquid-cooled heat sink.

In one implementation, the second liquid-cooled heat sink may be integrated with the multi-component electronic assembly comprising the at least one first electronic component and the at least one second electronic component. The integration may be by, for instance, by adhesively affixing the second liquid-cooled heat sink to the at least one second electronic component to be cooled.

The fluid couplers may project from either the first liquid-cooled heat sink or the second liquid-cooled heat sink, and in one example, are rigid, cylindrical-shaped projections, each with one or more sealing rings around a periphery thereof. The fluid couplers are sized and configured to project into respective coolant ports in the other of the first liquid-cooled heat sink or second liquid-cooled heat sink with operative coupling of the first liquid-cooled heat sink and the second liquid-cooled heat sink. A loading mechanism, such as described above, applies a compressive loading to the first and second liquid-cooled heat sinks, and this compressive loading facilitates forming a fluid-tight seal between the first and second liquid-cooled heat sinks about the fluid couplers disposed within the respective coolant ports. In an alternate embodiment, sealing rings may also be associated with the coolant ports to facilitate fluid-tight coupling between the two heat sinks with, for instance, compressive loading of the first liquid-cooled heat sink onto the second liquid-cooled heat sink.

In one example, liquid coolant flows through the at least one coolant-carrying second channel of the second liquid-cooled heat sink, after passing through the at least one coolant-carrying first channel of the first liquid-cooled heat sink. The first liquid-cooled heat sink may facilitate removal of heat generated by multiple first electronic components, and the at least one second electronic component may reside in between different groups of first electronic components, as in the case described above in connection with the hub module assembly of FIGS. 3-5. The second liquid-cooled heat sink is disposed over the at least one second electronic component, and in thermal communication therewith. The multiple first electronic components may comprise multiple optical modules of a hub module assembly, and the at least one second electronic component may comprise the hub chip of the hub module assembly. In this configuration, the first liquid-cooled heat sink extends at least partially over the multiple optical modules to facilitate removal of heat therefrom, and the second liquid-cooled heat sink physically engages the hub chip, and is disposed between the hub chip and the first liquid-cooled heat sink. A first global optic heat spreader and a second global optic heat spreader may be disposed over respective groups of optical modules on the opposite sides of the hub chip, and the first and second global optic heat spreaders facilitate transfer of heat from the multiple optical modules, to the first liquid-cooled heat sink, as well as, in one implementation, the second liquid-cooled heat sink, that is, assuming that the global optic heat spreaders are in thermal communication with the second liquid-cooled heat sink.

As one example, the first liquid-cooled heat sink comprises a plurality of coolant-carrying first channels arrayed in parallel, for instance, formed by a plurality of parallel-extending fins, and the second liquid-cooled heat sink comprises a plurality of coolant-carrying second channels arrayed in parallel, and formed, for instance, via a plurality of parallel-extending fins. In one implementation, the plurality of first channels of the first liquid-cooled heat sink are oriented orthogonal to the plurality of coolant-carrying second channels of the second liquid-cooled heat sink.

Figure 7A:
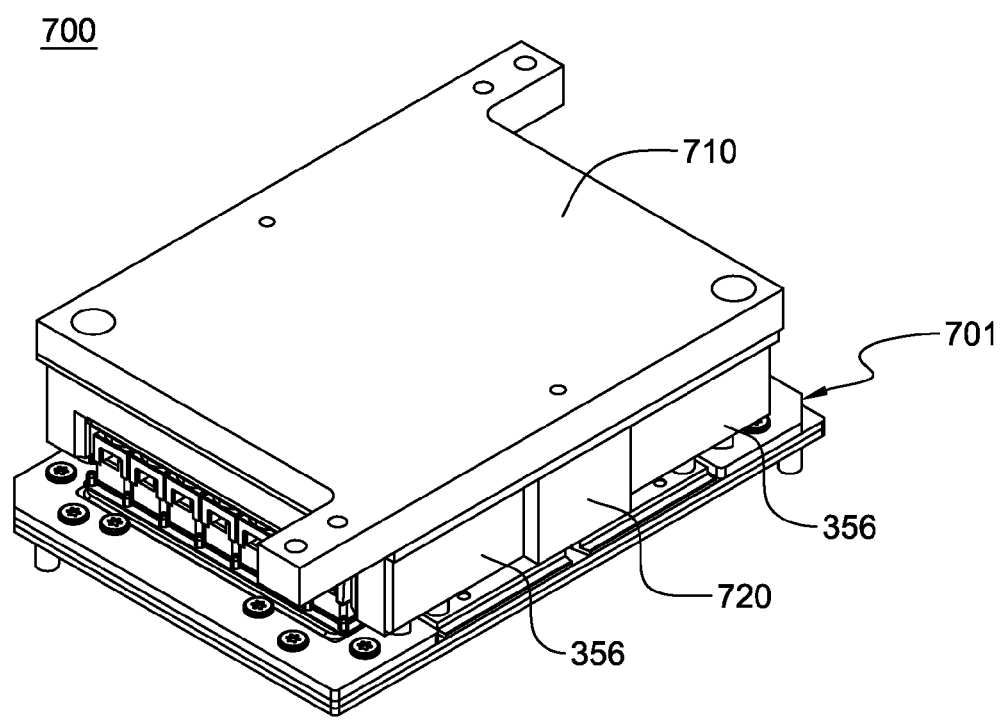
FIG. 7A is an isometric view of another embodiment of a cooled electronic system comprising a hub module assembly and an alternate embodiment of a cooling apparatus, in accordance with one or more aspects of the present invention.
Figure 7B:
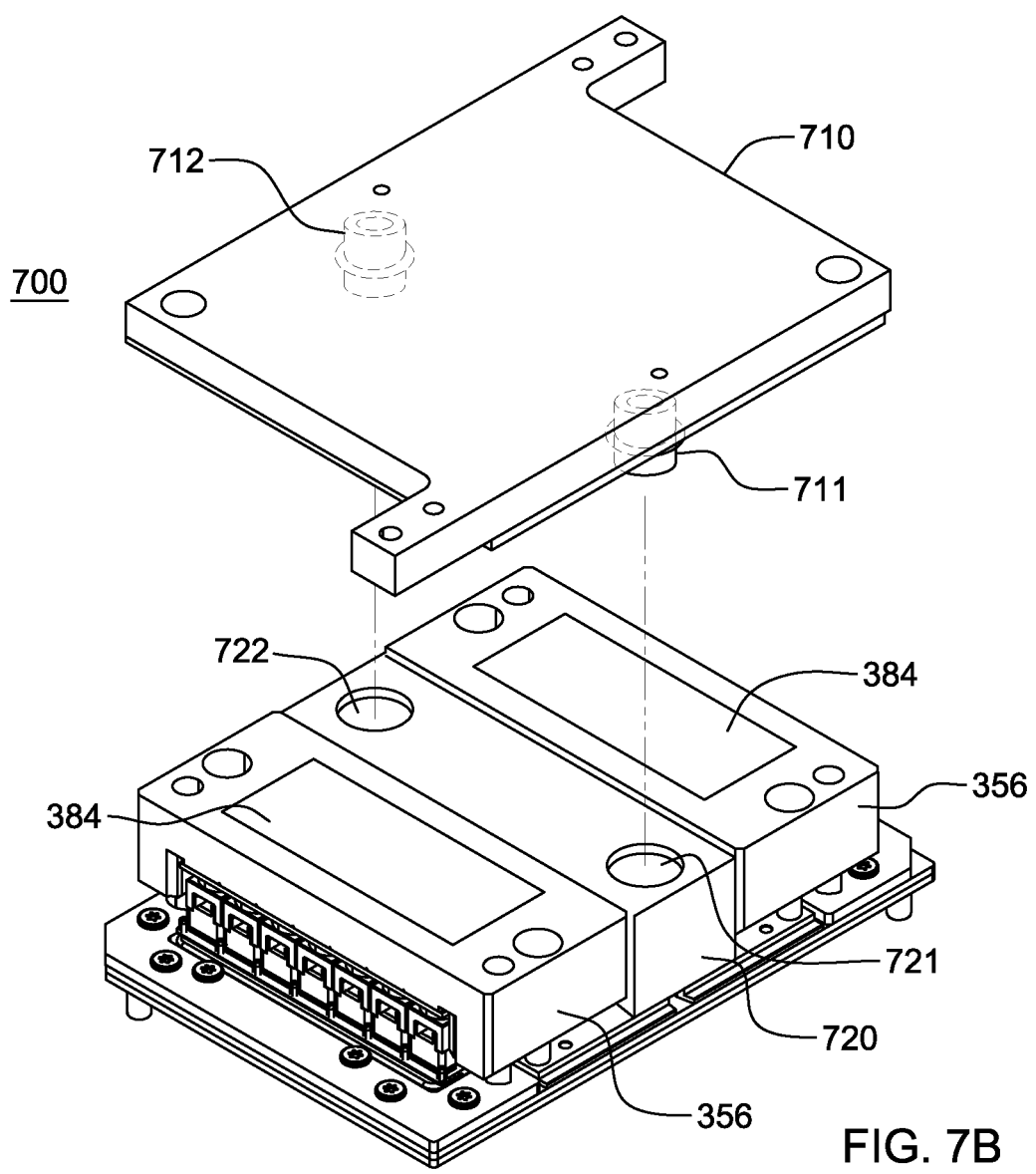
FIG. 7B is a partially exploded view of the cooled electronic system of FIG. 7A, with the separably-coupled, first liquid-cooled heat sink shown exploded from the cooled electronic system and illustrating removal of the fluid couplers from respective fluid ports of the fixedly-secured, second liquid-cooled heat sink of the cooling apparatus, in accordance with one or more aspects of the present invention.

By way of specific example, FIGS. 7A & 7B depict one embodiment of a cooled electronic system, generally denoted 700, illustrated without the loading mechanism. In one instance, the loading mechanism is similar to that described above in connection with the cooled electronic assembly embodiment of FIGS. 3-5. In this example, the cooled electronic system comprises a multi-component assembly 701, such as the above-described hub module assembly of FIGS. 3-5. The cooling apparatus of the cooled electronic assembly comprises a first liquid-cooled heat sink 710 and a second liquid-cooled heat sink 720. In this example, the second liquid-cooled heat sink is (for instance) a liquid-cooled cold plate configured to reside between the global optic heat spreaders 356 of a hub module assembly, and be in thermal communication with and mechanically coupled to the one or more second electronic components to be cooled, in this example, the hub chip disposed between the different groups of optics modules.

In one example, the first and second liquid-cooled heat sinks 710, 720 are each fabricated of metal and each include one or more coolant-carrying channels extending therethrough. By way of example, the liquid coolant flowing through the first and second liquid-cooled heat sinks may comprise water. In the depicted implementation, the fluid couplers 711, 712 project from the bottom surface of the first liquid-cooled heat sink 710, and are sized and configured to fluidically couple in a fluid-tight manner to the second liquid-cooled heat sink 720 within respective coolant ports 721, 722 (FIG. 7B) of the second liquid-cooled heat sink 720. Note that the cooled electronic assembly 700 of FIGS. 7A & 7B is similar to that described in connection with FIGS. 3-5, except that the solid thermal spreader 320 of FIGS. 3-5 has been replaced with the fixedly-secured, second liquid-cooled heat sink (or cold plate), as described herein, and a mechanism is provided to ensure fluid-tight coupling between the first and second liquid-cooled heat sinks. In this configuration, the second liquid-cooled heat sink may be bonded to the electronic assembly substrate, rendering the second liquid-cooled heat sink fixedly secured to or integral with the electronic assembly.

Figure 8A:
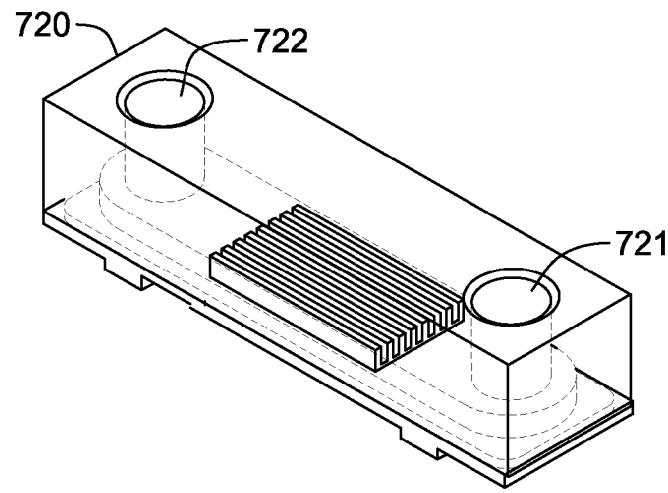
FIG. 8A is an isometric view of one embodiment of the fixedly-secured, second liquid-cooled heat sink of the cooling apparatus of FIGS. 7A & 7B, in accordance with one or more aspects of the present invention.
Figure 8B:
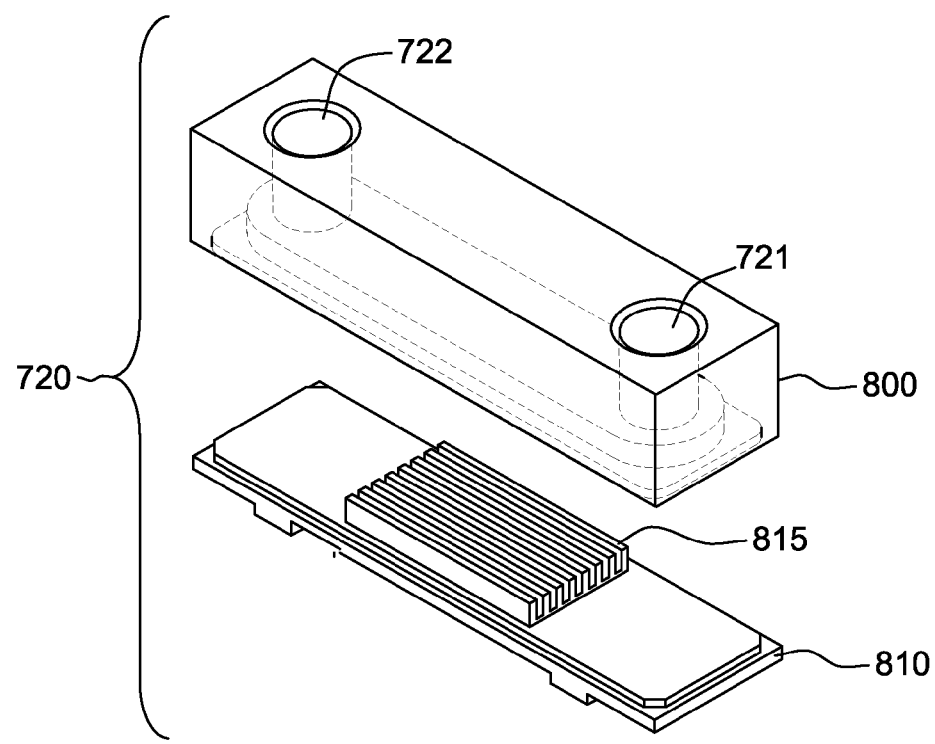
FIG. 8B is a partially exploded view of the fixedly-secured, second liquid-cooled heat sink of FIG. 8A, in accordance with one or more aspects of the present invention.

FIGS. 8A & 8B depict one embodiment of the fixedly-secured, second liquid-cooled heat sink 720, illustrating the structure in greater detail. In this two-piece configuration, second liquid-cooled heat sink 720 includes a lid structure 800 and a base structure 810, which are sized and configured to seal together and define therebetween the one or more coolant-carrying second channels of the second liquid-cooled heat sink. A plurality of fins 815 are illustrated extending from base structure 810. The plurality of fins may comprise a plurality of thermally conductive fins, such as thermally conductive plate fins spaced apart in parallel, opposing relation to define a plurality of second channels extending therethrough. When lid structure 800 is sealed to base structure 810, and liquid coolant is provided via coolant ports 721, 722, the liquid coolant flows through the channels defined between the plurality of fins 815 and thereby facilitates removal of heat from the second liquid-cooled heat sink. This structure provides the means to deliver liquid coolant, such as water, in close proximity to the one or more second electronic components of the multi-component assembly to be cooled. The lid structure and base structure of the second liquid-cooled heat sink are thermally conductive and may be brazed together to form the cold plate structure. Note that in this configuration, a single pass cross-flow configuration is shown by way of example only. Both the heat transfer enhancement, and the flow configuration through the second liquid-cooled heat sink may be achieved in a multitude of ways, without departing from the nature of the inventive concepts disclosed herein.

Figure 9A:
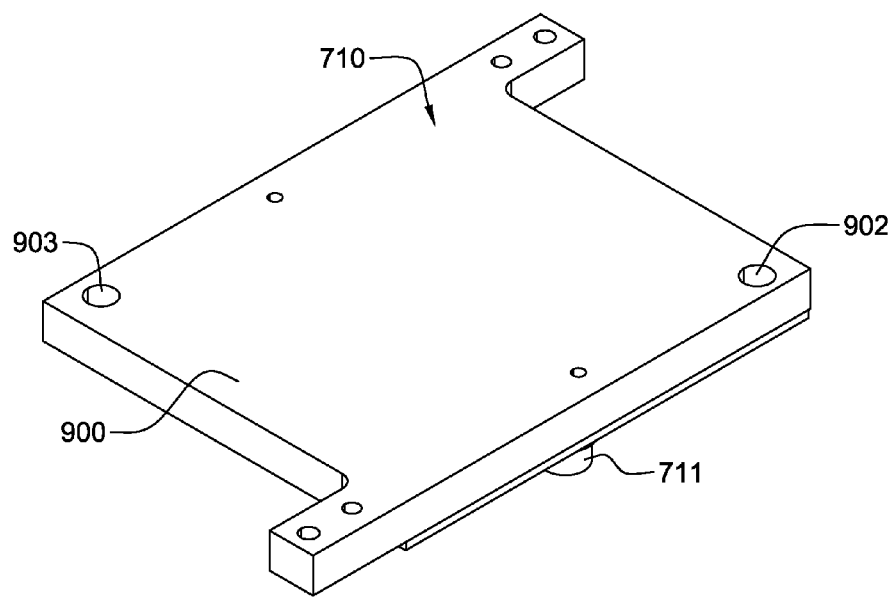
FIG. 9A is a top isometric view of one embodiment of the separably-coupled, first liquid-cooled heat sink of FIGS. 7A & 7B, in accordance with one or more aspects of the present invention.
Figure 9B:
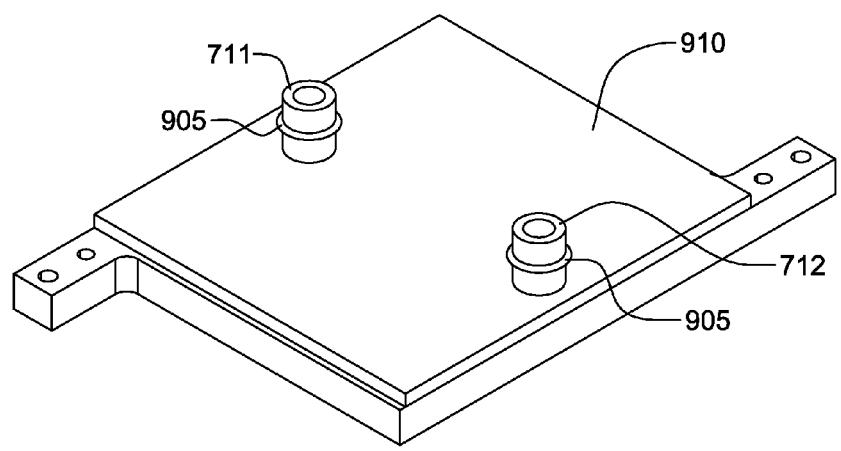
FIG. 9B is a bottom isometric view of the separably-coupled, first liquid-cooled heat sink of FIG. 9A, in accordance with one or more aspects of the present invention.
Figure 9C:
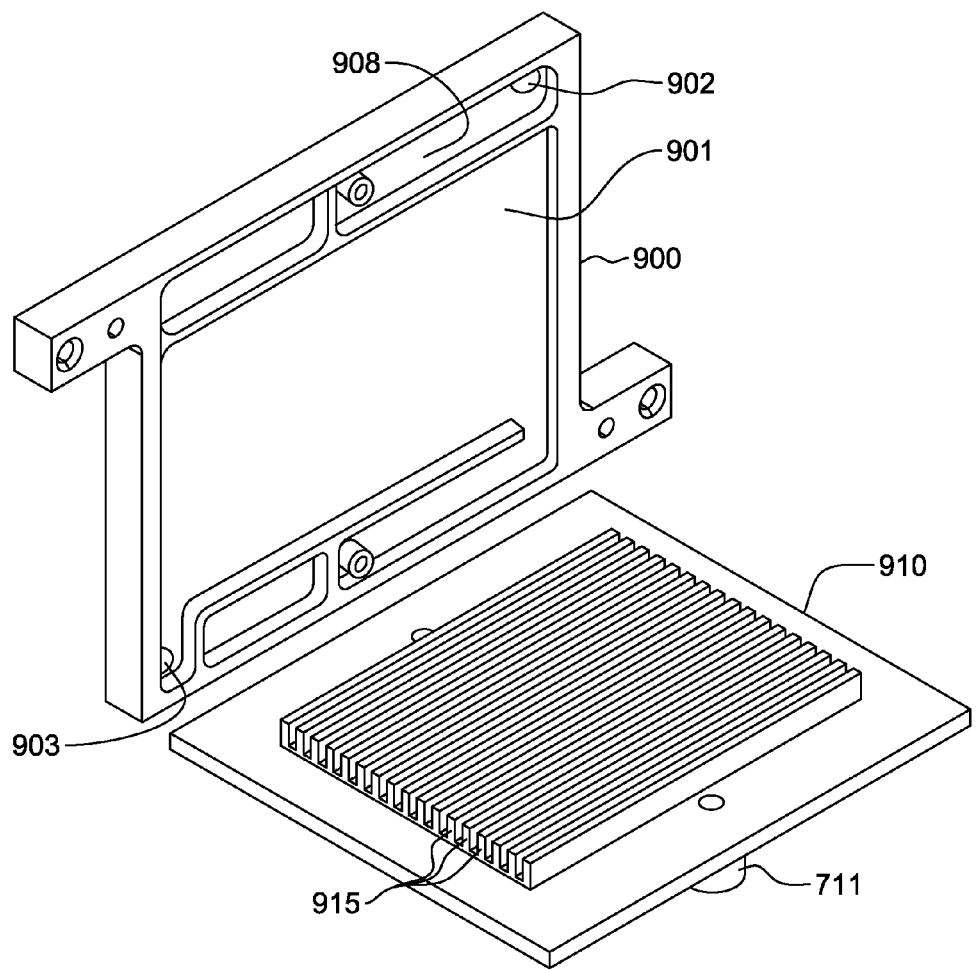
FIG. 9C is a partially exploded view of the separably-coupled, first liquid-cooled heat sink of FIGS. 9A & 9B, in accordance with one or more aspects of the present invention.

FIGS. 9A-9C depict one embodiment of first liquid-cooled heat sink 710. In this embodiment, first liquid-cooled heat sink 710 comprises a two-piece embodiment which includes a lid structure 900 and a base structure 910, with a plurality of thermally conductive fins 915 shown extending from base structure 910 into an appropriately-sized recess 901 in lid structure 900. The plurality of fins 915 comprise, for instance, a plurality of plate-type fins disposed in spaced, opposing relation to define multiple, parallel single-pass, coolant-carrying channels therebetween. Note that the single-pass, cross-sectional flow configuration of the first liquid-cooled cold plate is also shown by way of example only, and not by way of limitation. Both the heat transfer enhancement and flow configuration through the first liquid-cooled heat sink can be varied without departing from the scope of the present invention. The lid structure 900 includes a coolant inlet 902 and a coolant outlet 903 which facilitate the flow of liquid coolant through the first liquid-cooled heat sink. Additionally, base structure 910 has projecting therefrom the fluid couplers 711, 712 discussed above. These fluid couplers comprise, in one example, rigid, hollow, cylindrical extensions from the first liquid-cooled heat sink, sized and configured to project into corresponding receiving coolant ports in the second liquid-cooled heat sink described above in connection with FIGS. 7A-8B. Fluid-tight coupling is facilitated by providing one or more sealing rings 905, such as O-rings, disposed about the periphery of fluid couplers 711, 712 and/or within the receiving ports of the second liquid-cooled heat sink. The lid structure 900 is configured with recesses 901, 908 to facilitate the desired coolant flow path through the first liquid-cooled heat sink, the fluid couplers and second liquid-cooled heat sink.

Figure 9D:
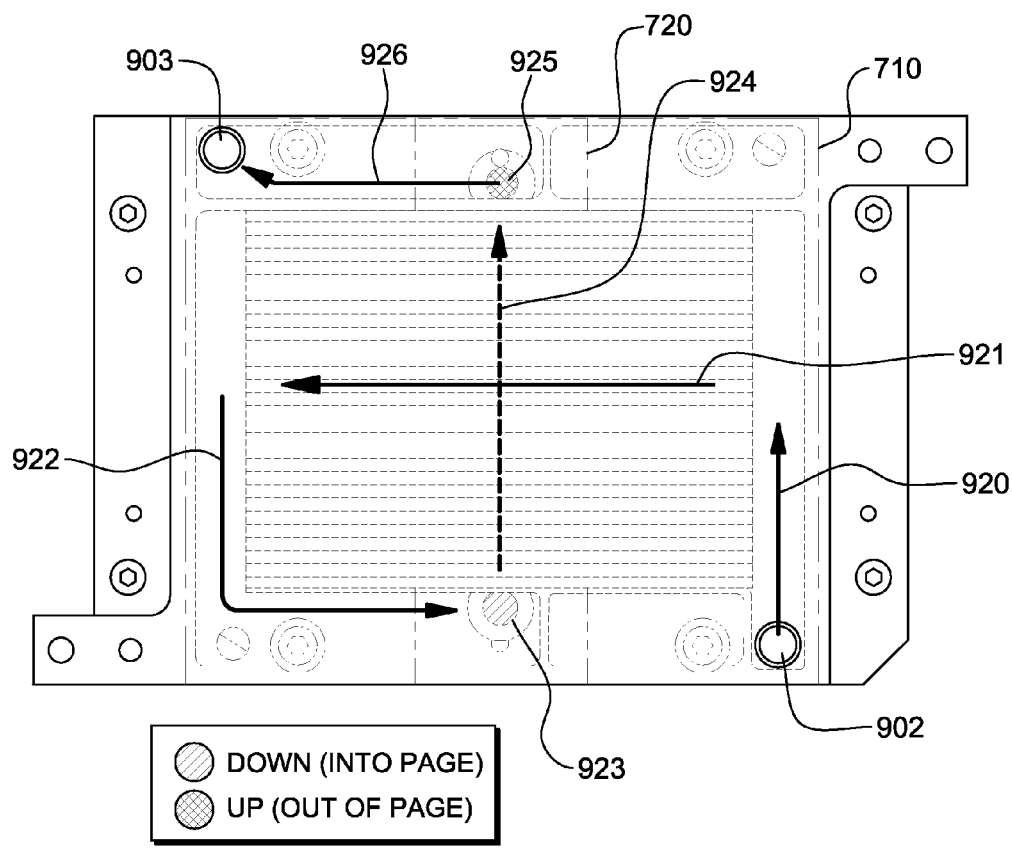
FIG. 9D is a top plan view of the cooling apparatus of FIGS. 7A-9C, and illustrating a liquid coolant flow path through the separably-coupled, first liquid-cooled heat sink, and then the fixedly-secured, second liquid-cooled heat sink, with the first and second liquid-cooled heat sinks being operatively fluidically coupled via the fluid couplers, in accordance with one or more aspects of the present invention.

FIG. 9D is a top plan view illustrating one example of a coolant flow path through the fluidically coupled first and second liquid-cooled heat sinks 710, 720. As described above, when the cooling apparatus is assembled onto the electronic assembly so that the second liquid-cooled heat sink is, for instance, fixedly-secured to the electronic assembly, and the separably-coupled, first liquid-cooled heat sink makes thermal contact with the global heat spreaders to cool the optics modules, the first liquid-cooled heat sink also fluidically connects to the second liquid-cooled heat sink via the illustrated fluid couplers. The fluid couplers are, in one instance, hollow cylindrical or tubular appendages, which fit concentrically within the respective coolant ports in the second liquid-cooled heat sink. An elastomeric O-ring provides an annular seal when the connection is made. A single O-ring is illustrated in the embodiments depicted, however, it should be understood that multiple O-rings could be implemented for redundancy. Also, note that the fluid couplers could be integral with the base structure of the first liquid-cooled heat sink, or could be brazed to the base structure, along with the lid.

As noted, FIG. 9D illustrates the assembled cooling apparatus and electronic assembly, with the flow path through the cooling apparatus depicted by arrows and coolant flow directions 920-926, as one example. Liquid coolant flow enters 920 the cooling apparatus at the coolant inlet 902 and flows 921 through the plurality of coolant-carrying channels of the first liquid-cooled heat sink. As noted above, the plurality of coolant-carrying first channels of the first liquid-cooled heat sink may be formed by a plurality of fins within the first heat sink. In this manner, one grouping of optics modules, and the other grouping of optics modules, are cooled by the first liquid-cooled heat sink. Coolant flow is then directed 922 to one of the fluid couplers to flow downwards 923 into the second liquid-cooled heat sink 720 that is in thermal communication with the one or more second electronic components, such as the hub chip. Coolant flow then passes 924 through the one or more second channels of the second liquid-cooled heat sink before exiting 925 back into the first liquid-cooled heat sink to flow 926 to the coolant return 903. Note that in this embodiment, the liquid coolant flow through the second coolant-carrying heat sink is approximately orthogonal to the coolant flow through the one or more coolant-carrying first channels of the first liquid-cooled heat sink. This is by way of illustration only, and not limitation.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include" (and any form of include, such as "includes" and "including"), and "contain" (and any form contain, such as "contains" and "containing") are open-ended linking verbs. As a result, a method or device that "comprises", "has", "includes" or "contains" one or more steps or elements possesses those one or more steps or elements, but is not limited to possessing only those one or more steps or elements. Likewise, a step of a method or an element of a device that "comprises", "has", "includes" or "contains" one or more features possesses those one or more features, but is not limited to possessing only those one or more features. Furthermore, a device or structure that is configured in a certain way is configured in at least that way, but may also be configured in ways that are not listed.

The corresponding structures, materials, acts, and equivalents of all means or step plus function elements in the claims below, if any, are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of one or more aspects of the invention and the practical application, and to enable others of ordinary skill in the art to understand one or more aspects of the invention for various embodiments with various modifications as are suited to the particular use contemplated.

What is claimed is:

1. A method comprising:
providing a first liquid-cooled heat sink comprising at least one coolant-carrying first channel, the first liquid-cooled heat sink being separably coupled to an electronic assembly comprising at least one first electronic component and at least one second electronic component, and being in thermal contact with the at least one first electronic component to facilitate thermal conduction of heat generated by at the least one first electronic component to the first liquid-cooled heat sink;
providing a second liquid-cooled heat sink comprising at least one coolant-carrying second channel, the second liquid-cooled heat sink being fixedly secured to the electronic assembly, and facilitating removal of heat generated by the at least one second electronic component; and
providing inlet and outlet fluid couplers positioned between and fluidically coupling the first and second liquid-cooled heat sinks and facilitating liquid coolant flow through the at least one coolant-carrying second channel of the fixedly-secured, second liquid-cooled heat sink from the separably-coupled, first liquid-cooled heat sink, wherein the first liquid-cooled heat sink overlies the second liquid-cooled heat sink, and the inlet and outlet fluid couplers reside in between and coupled in fluid communication the second liquid-cooled heat sink and the overlying first liquid-cooled heat sink.

2. The method of claim 1, wherein the fluid couplers project from one of the first liquid-cooled heat sink or the second liquid-cooled heat sink, and project into respective coolant ports in the other of the first liquid-cooled heat sink or second liquid-cooled heat sink.

3. The method of claim 2, further comprising providing a loading mechanism, the loading mechanism applying, at least in part, a compressive loading to the first and second liquid-cooled heat sinks, with the separably-coupled, first liquid-cooled heat sink disposed over the fixedly-secured, second liquid-cooled heat sink, the compressive loading facilitating forming a fluid-tight seal between the first and second liquid-cooled heat sinks about the fluid couplers.

4. The method of claim 3, further comprising providing sealing rings associated with at least one of the fluid couplers or the coolant ports, the sealing rings facilitating fluid-tight coupling between the first liquid-cooled heat sink and the second liquid-cooled heat sink, with the compressive loading of the first and second liquid-cooled heat sinks, and the fluid couplers disposed within the respective coolant ports.

5. The method of claim 1, wherein the liquid coolant flows through the at least one coolant-carrying second channel of the fixedly-secured, second liquid-cooled heat sink after passing through the at least one coolant-carrying first channel of the separably-coupled, first liquid-cooled heat sink.

6. The method of claim 1, wherein the separably-coupled, first liquid-cooled heat sink comprises a plurality of coolant-carrying first channels arrayed in parallel, and the fixedly-secured, second liquid-cooled heat sink comprises a plurality of coolant-carrying second channels arrayed in parallel.

7. The method of claim 6, wherein the plurality of coolant-carrying first channels of the separately-coupled, first liquid-cooled heat sink are oriented orthogonal to the plurality of coolant-carrying second channels of the fixedly-secured, second liquid-cooled heat sink.

8. A method comprising:
providing a first liquid-cooled heat sink comprising at least one coolant-carrying first channel, the first liquid-cooled heat sink being separably coupled to an electronic assembly comprising at least one first electronic component and at least one second electronic component, and facilitating removal of heat generated by at the least one first electronic component;
providing a second liquid-cooled heat sink comprising at least one coolant-carrying second channel, the second liquid-cooled heat sink being fixedly secured to the electronic assembly, and facilitating removal of heat generated by the at least one second electronic component; and
providing fluid couplers fluidically coupling the first and second liquid-cooled heat sinks and facilitating liquid coolant flow through the at least one coolant-carrying second channel of the fixedly-secured, second liquid-cooled heat sink from the separably-coupled, first liquid-cooled heat sink;
wherein the liquid coolant flows through the at least one coolant-carrying second channel of the fixedly-secured, second liquid-cooled heat sink after passing through the at least one coolant-carrying first channel of the separably-coupled, first liquid-cooled heat sink; and
wherein the first liquid-cooled heat sink facilitates removal of heat generated by multiple first electronic components, and wherein the at least one second electronic component resides in between first electronic components of the multiple first electronic components, and the second liquid-cooled heat sink is disposed over the at least one second electronic component and in thermal communication therewith.

9. The method of claim 8, wherein the multiple first electronic components comprise multiple optical modules of a hub module assembly, and the at least one second electronic component comprises a hub chip of the hub module assembly, and wherein the first liquid-cooled heat sink extends at least partially over the multiple optical modules to facilitate removal of heat therefrom, and the second liquid-cooled heat sink engages the hub chip and is disposed between the hub chip and the first liquid-cooled heat sink.

10. The method of claim 9, further comprising providing a first global optics heat spreader and a second global optics heat spreader disposed over respective optical modules on opposite sides of the hub chip, the first and second global optics heat spreaders facilitating transfer of heat from the multiple optical modules to the first liquid-cooled heat sink.

11. A method comprising:
fabricating a cooling apparatus to facilitate cooling at least one first electronic component and at least one second electronic component of an electronic assembly, the fabricating comprising:
separably coupling a first liquid-cooled heat sink to the electronic assembly in thermal contact with the at least one first electronic component to facilitate thermal conduction of heat generated by the at least one first electronic component to the first liquid-cooled heat sink, the first liquid-cooled heat sink comprising at least one coolant-carrying first channel;
fixedly securing a second liquid-cooled heat sink to the electronic assembly to facilitate removal of heat generated by the at least one second electronic component, the second liquid-cooled heat sink comprising at least one coolant-carrying second channel; and
providing inlet and outlet fluid couplers positioned between and fluidically coupling the first and second liquid-cooled heat sinks, the fluidic coupling facilitating liquid coolant flow through the at least one coolant-carrying second channel of the fixedly-secured, second liquid-cooled heat sink from the separably-coupled, first liquid-cooled heat sink, wherein the first liquid-cooled heat sink overlies the second liquid-cooled heat sink, and the inlet and outlet fluid couplers reside in between and couple in fluid communication the second liquid-cooled heat sink and the overlying first liquid-cooled heat sink.

12. The method of claim 11, further comprising providing the fluid couplers integral with and projecting from one of the first liquid-cooled heat sink or the second liquid-cooled heat sink, and providing respective coolant ports in the other of the first liquid-cooled heat sink or second liquid-cooled heat sink, and further comprising operatively disposing the first liquid-cooled heat sink, at least partially, over the second liquid-cooled heat sink so that the fluid couplers engage the respective coolant ports and fluidically couple the first and second liquid-cooled heat sinks.

13. The method of claim 12, further comprising providing a compressive loading to the first and second liquid-cooled heat sinks with the separately-coupled, first liquid-cooled heat sink disposed over the fixedly-secured, second liquid-cooled heat sink, the compressive loading facilitate forming a fluid-tight seal between the first and second liquid-cooled heat sinks about the fluid couplers.

\* \* \* \* \*